(12) United States Patent
Nixon

(10) Patent No.: US 11,947,382 B2
(45) Date of Patent: Apr. 2, 2024

(54) MEASURING A TIMING MARGIN OF A MEMORY DEVICE USING AN INTERNAL OSCILLOSCOPE

(71) Applicant: MICRON TECHNOLOGY, INC., Boise, ID (US)

(72) Inventor: Brandon Richard Nixon, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 17/877,532

(22) Filed: Jul. 29, 2022

(65) Prior Publication Data

US 2024/0036600 A1 Feb. 1, 2024

(51) Int. Cl.
*G06F 1/12* (2006.01)
*G06F 1/14* (2006.01)

(52) U.S. Cl.
CPC .................... *G06F 1/14* (2013.01)

(58) Field of Classification Search
CPC ........................................ G06F 1/14
See application file for complete search history.

(56) References Cited

U.S. PATENT DOCUMENTS

| 2011/0274215 A1* | 11/2011 | Hollis | H04L 7/0054 375/317 |
| 2017/0070219 A1* | 3/2017 | Ichida | H03K 5/134 |
| 2019/0034365 A1* | 1/2019 | Lovelace | G06F 13/1684 |

* cited by examiner

*Primary Examiner* — Nitin C Patel
(74) *Attorney, Agent, or Firm* — Lowenstein Sandler LLP

(57) ABSTRACT

A known randomized data pattern at a predetermined reference voltage of the internal oscilloscope is inputted to an internal oscilloscope of the receiving device for each delay tap element of a plurality of consecutive delay tap elements applied to a system clock of a receiving device. A first delay tap element among the plurality of consecutive delay tap elements in which an output of the internal oscilloscope matches the known randomized data pattern is identified. Responsive to identifying the first delay tap element, a last delay tap element among the plurality of consecutive delay tap elements in which the output of the internal oscilloscope matches the known randomized data pattern is identified.

20 Claims, 6 Drawing Sheets

400

For each delay tap element of a plurality of consecutive delay tap elements used to delay a system clock inputted into an internal oscillator of a receiving device, input, to the internal oscillator of the receiving device with a predetermined reference voltage, a known randomized data pattern. 410

Identify a first delay tap element among the plurality of consecutive delay tap elements in which an output of the internal oscillator matches the known randomized data pattern. 420

Responsive to identifying the first delay tap element, identify a last delay tap element among the plurality of consecutive delay tap elements in which the output of the internal oscillator matches the known randomized data pattern. 430

FIG. 4

Input known randomized data patterns into an internal oscillator of a receiving device at a first reference voltage with varying delays applied to a system clock of the receiving device. 510

Identify a first delay amount associated with a first delay of the varying delays in which the known randomized data patterns matches an output of the internal oscillator. 520

Identify a second delay amount associated with a last delay of the varying delays in which the known randomized data patterns matches the output of the internal oscillator. 530

Generate a graph of the first delay amount and the second delay amount at the first reference voltage. 540

FIG. 5

MEASURING A TIMING MARGIN OF A MEMORY DEVICE USING AN INTERNAL OSCILLOSCOPE

TECHNICAL FIELD

Embodiments of the disclosure relate generally to memory sub-systems, and more specifically, relate to measuring a timing margin of a memory device using an internal oscilloscope.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is a flow diagram of an example method of measuring a timing margin of a memory device using an internal oscilloscope, in accordance with some embodiments of the present disclosure;

FIG. 5 is a flow diagram of an example method of measuring a timing margin of a memory device using an internal oscilloscope, in accordance with some embodiments of the present disclosure.

DETAILED DESCRIPTION

Figure 1:
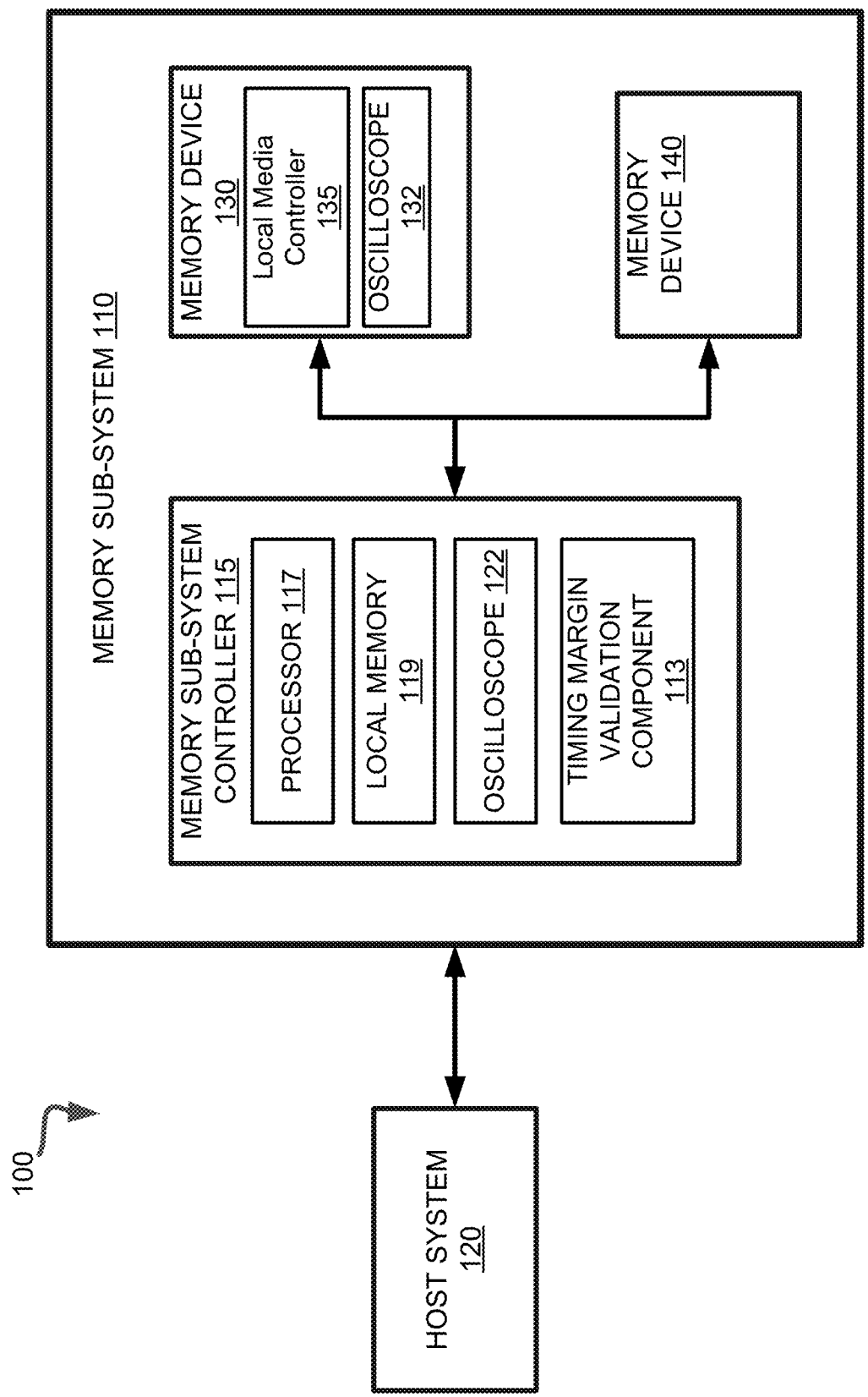
FIG. 1 illustrates an example computing system that includes a memory sub-system, in accordance with some embodiments of the present disclosure.

Aspects of the present disclosure are directed to measuring a timing margin of a memory device using an internal oscilloscope. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can be one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

The memory sub-system can include a controller configured to manage communication from a host system to store data to and/or retrieve data from the memory devices of the memory sub-system. The data is transferred over various channels each connected to a memory device of the memory sub-system. A channel may refer to a communications link connecting the controller to the memory devices. Channels are configured to support media throughput in order to process commands (such as read, write, read status, get feature, etc.) from a host system which may be compliant with Open NAND Flash Interface (ONFI) specifications to send and receive commands in accordance with the ONFI protocol.

A memory sub-system can include an internal clock component that manages the timing of various operations, such as write operations, read operations, refresh operations, etc. To properly execute such operations, a memory device can include a replica of the memory sub-system's clock circuitry. When the memory sub-system is powered on, the memory sub-system controller performs a series of steps to initialize and calibrate the memory device's replica clock circuitry. The steps can include command address training, during which the memory sub-system controller aligns the clock signal with the command address signal; write leveling, during which the memory sub-system controller determines the relationship between the memory sub-system's internal clock and the memory device's replica clock circuitry, providing a sufficient margin to cover any drift that many occur during system operation; read training, during which the memory sub-system controller determines an offset to apply to the memory device's replica clock circuitry to accurately read data output from the memory device; and write training, during with the memory sub-system controller determines an offset to apply to the memory device's replica clock circuitry to accurately write data to the memory device. In embodiments, read training and write training align the data bus to the memory device's replica clock circuitry.

Hence, to ensure proper timing parameters for the various operations, the memory sub-system controller can perform read and write training at initializing of the memory sub-system. Write or read training ensures that data is reliably written to or read from a memory device. Since a memory device can experience a delay between when a signal is sent and when it is received by the memory device at the desired location, the write and read training procedure includes determining the appropriate write or read latency delay between the internal write or read command and the availability of the first bit of input data or output data. The write or read latency delay can be an offset, for example, a set number of clock cycles. The memory sub-system controller can determine the offset, and can set the corresponding timing parameters to the appropriate value to ensure data is reliably written to or read from the memory device. The memory device can apply the offset to its replica clock circuitry to implement the write or read operation's timing parameters. The offset may be applied to the replica clock based on a delay-locked loop (DLL) of the memory sub-system acting as a negative-delay gate placed in the clock path (e.g., signal strobe delay (DQS)). The DLL may include various delay tap elements each used individually or collectively to apply the offset to the replica clock. Each delay tap element is associated with a preset delay which allows the DQ to be shifted in time as to allow data to be read and/or written either earlier or later in time.

During operation of the memory sub-system, changes to supply voltage or temperature can gradually shift the write and read positions away from the offset positions determined during read and write training. Thus, in some memory sub-systems, the memory sub-system controller can repeat the write training and read training procedures at regular intervals. In some memory sub-systems, a memory device's internal clock replica can provide input to an oscilloscope. The memory sub-system controller can use the oscilloscope to monitor changes in the memory device's internal clock delays caused by shifts in voltage and/or temperature. The oscilloscope can be a ring oscilloscope capable of detecting variations in process, voltage, and/or temperature (PVT) of the memory device. The change in PVT can be reflected as a change in oscillation frequency. Some memory sub-system controllers use the oscilloscope frequency to adjust the write latency offsets, and to determine when to repeat the write and/or read training procedures.

In some implementations, a simulation may be performed to obtain a representative waveform model with several parameters relevant to the receiving device, such as an aperture (e.g., timing margin), a slew rate, and an overall signal voltage level. The aperture of the representative waveform model, in some implementations, is used to indicate a window in which the receiving device can correctly read the signal as a high (e.g., binary value of "1") or low (e.g., binary value of "0"). The representative waveform model when examined provides a determination on whether requirements (e.g., distinguishing between a signal associated with a binary value of "1" and a signal associated with a binary value of "0") of the receiving device are met. Depending on the implementation, requirements are governed by protocols, such as those associated with ONFI devices and/or double data rate (DDR) devices which are typically defined in a manner (e.g., conservatively) to ensure that the channels connected to the receiving device does not produce bit errors. Depending on the implementation, the aperture of the representative waveform model may include channel effects of package and PCB crosstalk and signal loss as well as jitter induced from these affects.

However, since the aperture (e.g., timing margin) of the representative waveform model is limited to the channel effects of package and PCB crosstalk and signal loss as well as jitter induced from these affects other aspects that may affect the timing margin are not accounted for within the timing margin. Accordingly, in some implementations, the timing margin may be (conservatively) reduced based on various assumptions of the transmitting device and/or the receiving device. For example, transmission jitter, setup and hold requirements, and/or one or more parameters of the receiving device and/or transmitting device (e.g., data valid window time pin of a memory device). The transmission jitter may refer to inherent jitter in the transmitting device as a result of the signal strobe delay (e.g., DQS) generated from the incoming clock. The setup and hold requirements of the receiving device may refer to a period of time necessary for the signal to be high or low, before and after the DQS transition. The parameter of the memory device, for example may be affected from duty cycle distortion and all uncertainty in the launch time of the signal from each DQ pin.

Thus, as ONFI interfaces (e.g., channels) speeds increase, timing margins of the channels tend to drastically decrease, and as a result, it becomes increasingly difficult to ensure that the channel is operating error free due to the inability to obtain an accurate measurement of the timing margin of the receiving device. In some implementation, the timing margin may be validated by measuring a point close to either the controller (e.g., application-specific integrated circuit (ASIC)) or memory device using an external tool (e.g., oscilloscope) to view the timing margin. Then, correlate the measurement with the timing margin of the representative waveform model (without the various assumptions applied to the timing margin of the representative waveform model). However, measuring each channel is time intensive and in most instances inaccurate due to the complexity of performing the measurement, accordingly, only a few channels are measured due to the time consumption.

Aspects of the present disclosure address the above and other deficiencies by using an internal oscilloscope (e.g., oscilloscope) of a receiving device (e.g., memory sub-system controller and/or memory device) to accurately measure an aperture (e.g., timing margin) of the receiving device. The memory sub-system controller may, at each delay tap element of the various delay tap elements, send via the input signal, known randomized data to the oscilloscope with a predetermined reference voltage. As previously described, the DLL may include various delay tap elements which individually or collectively apply an offset to a clock. The predetermined reference voltage may be a percentage (e.g., 50%) of the input signal inputted into the oscilloscope. In some embodiments, the known randomized data is changed with each delay tap element. The memory sub-system controller may identify a first delay tap element of the various delay tap elements in which outputted data from the oscilloscope is valid. Outputted data from the oscilloscope is valid if the outputted data matches the known randomized data and invalid if the outputted data does not match the known randomized data. Responsive to identifying the first delay tap element of the various delay tap elements, the memory sub-system controller identifies a last delay tap element of the various delay tap elements in which the outputted data from the oscilloscope is valid.

Each delay tap element of the various delay tap elements refers to a variable that is inputted (sequentially or consecutively) into a DLL of the oscilloscope and used to adjust (e.g., add delay to) a signal strobe delay (e.g., DQS) inputted into a flip-flop of the oscilloscope. Each delay tap element of the various delay tap elements may have a predetermined delay time value. The predetermined delay time value for each delay tap element of the various delay tap elements is based on a total bit period allocated to receive data at the receiving device and a number of the various delay tap elements. For example, the total bit period may be 833 picoseconds which is divided by the number of the various delay tap elements (e.g., 34 delay tap elements) resulting in a predetermined delay time value of 24.5 ps for each delay tap element.

Accordingly, the memory sub-system controller determines a timing window associated with the predetermined reference voltage, based on a total delay time value of the first delay tap element and a total delay time value of the last delay tap element. The total delay time value of the first delay tap element may correspond to a number of iterations of the various delay tap elements performed to arrive at the first delay tap element (e.g., 5 delay tap elements) multiplied by the predetermined delay time value (e.g., 24.5 ps). The total delay time value of the last delay tap element may correspond to a number of iterations of the various delay tap elements performed to arrive at the last delay tap element (e.g., 20 delay tap elements) multiplied by the predetermined delay time value (e.g., 24.5 ps). In some embodiments, the memory sub-system controller may, instead of identifying the last delay tap element in which the outputted data from the oscilloscope is valid, identify a first delay tap element in which the outputted data from the oscilloscope is invalid. Accordingly, a total delay time value of the first delay tap element in which the outputted data from the oscilloscope is invalid may correspond to a number of iterations of the various delay tap elements performed to arrive at the first delay tap element in which the outputted data from the oscilloscope is invalid minus 1 (e.g., 21 delay tap elements minus 1) multiplied by the predetermined delay time value (e.g., 24.5 ps), thereby corresponding to the last delay tap element of the various delay tap elements in which the outputted data from the oscilloscope is valid.

In some embodiments, the memory sub-system controller may vary (e.g., sweep) the predetermined reference voltage to obtain additional timing windows. In particular, the predetermined reference voltage is either increased or decreased stepwise (e.g., each step associated with a predetermined increase or decrease in the predetermined reference voltage). Responsive to varying the predetermined reference voltage, the memory sub-system controller may, at each delay tap element of the various delay tap elements, send via the input signal, known randomized data to the oscilloscope, read the outputted data, and determine a timing window associated with each varied predetermined reference voltage. Depending on the embodiment, the memory sub-system controller may increase the predetermined reference voltage until at each delay tap element of the various delay tap elements the outputted data is invalid and then decrease the predetermined reference voltage until at each delay tap element of the various delay tap elements of the outputted data is invalid. In another embodiment, the memory sub-system controller may decrease the predetermined reference voltage until at each delay tap element of the various delay tap elements the outputted data is invalid and then increase the predetermined reference voltage until at each delay tap element of the various delay tap elements the outputted data is invalid.

Depending on the embodiment, the memory sub-system controller may graph each of the timing windows (e.g., the timing window associated with the predetermined reference voltage and the timing window associated with the varied predetermined reference voltage) to provide an aperture (e.g., timing margin) associated with the memory sub-system. The aperture refers to a window in which the receiving device can correctly, at any Vref and or delay, read the signal as a high (e.g., binary value of "1") or low (e.g., binary value of "0") without errors. The delay may be caused by transmission issues (e.g., jitter, duty cycle distortion, etc.) and requirements of the receiving device (e.g., setup and hold requirements).

Advantages of the present disclosure include, but are not limited to, reducing excessive timing margins designed into the memory sub-system controller based on assumptions of the components within the memory sub-system controller by measuring an actual internal timing margin of the components within the receiving device (e.g., memory sub-system controller and/or memory device) using the internal oscilloscope.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a timing margin validation component 113 that can measure, using an internal oscilloscope 122 and/or 132, a timing margin of the memory sub-system controller 115 and/or memory device 130 and/or 140. In some embodiments, the memory sub-system controller 115 includes at least a portion of the timing margin validation component 113. In some embodiments, the timing margin validation component 113 is part of the host system 110, an application, or an operating system. In other embodiments, local media controller 135 includes at least a portion of the timing margin validation component 113 and is configured to perform the functionality described herein.

The timing margin validation component 113 utilizes the internal oscilloscope 122 and/or 132 to measure a timing margin of the memory sub-system controller 115 and/or memory device 130 and/or 140, respectively. The timing margin validation component 113 may send to the internal oscilloscope 122 and/or 132, via an input signal (e.g., DQ), a known randomized data from a plurality of known randomized data at various delays to be written (e.g., stored) and read.

In particular, the timing margin validation component 113 may apply a delay to a signal strobe delay (e.g., DQS) by applying, consecutively, each delay tap element of a plurality of consecutive delay tap elements to a delay-lock loop (DLL) of the internal oscilloscope 122 and/or 132. Depending on the embodiment, the plurality of consecutive delay tap elements available for the DLL may be stored in the memory sub-system controller 115 and/or the memory device 130 and/or 140. The DQS with the applied delay is inputted into a flip-flop of the internal oscilloscope 122 and/or 132 to control the output of the flip-flop's input. Once the delay is applied, the timing margin validation component 113 inputs a known randomized data via the DQ into the flip-flop. In some embodiments, prior to inputting the known randomized data into the flip-flop, the inputted known randomized data is compared with a predetermined reference voltage (Vref) (e.g., half the DQ) to generate an output based on the comparison. Once the flip-flop receives the inputted known randomized data and the DQS with the applied delay, the flip-flop stores the inputted known randomized data according to the DQS with the applied delay. For example, the flip-flop provides the input (e.g., the inputted known randomized data) to the output of the flip-flop at an edge (e.g., rising edge or falling edge) of the applied clock (e.g., DQS with the applied delay).

The timing margin validation component 113 may determine whether the output of the flip-flop is valid. The timing margin validation component 113 determines that the output of the flip-flop is valid if the output of the flip-flop matches the inputted known randomized data, otherwise the output of the flip-flop is invalid. The timing margin validation component 113 identifies a first delay tap element of the plurality of consecutive delay tap elements in which the output of the flip-flop is valid and a last delay tap element of the plurality of consecutive delay tap elements in which the output of the flip-flop is valid (or a first delay tap element of the plurality of consecutive delay tap elements in which the output of the flip-flop is invalid after the first delay tap element of the plurality of delay tap elements in which the output of the flip-flop was valid). In some instances, with each application of a delay tap element of the plurality of the delay tap elements to the DLL, the timing margin validation component 113 may input a different known randomized data to account for all potential effects of crosstalk.

The timing margin validation component 113 may determine a total delay time value associated with the first delay tap element in which the output of the flip-flop is valid and a total delay time value associated with the last delay tap element in which the output of the flip-flop is valid. Each delay tap element of the plurality of consecutive delay tap elements applied to the DLL adds a predetermined delay time value to the DQS. The predetermined delay time value is determined by a total bit period allocated to receive data at the receiving device (e.g., the memory sub-system controller 115 and/or memory device 130 and/or 140) divided by a number of the plurality of consecutive delay tap elements.

The total delay time value associated with the first delay tap element in which the output of the flip-flop is valid equates to a number of delay tap elements iterated through to arrive at the first delay tap element multiplied by the predetermined delay time value. Additionally, the total delay time value associated with the last delay tap element in which the output of the flip-flop is valid equates to a number of delay tap elements iterated through to arrive at the last delay tap element multiplied by the predetermined delay time value. In the instances that the timing margin validation component 113 uses the first delay tap element in which the output of the flip-flop is invalid after the first delay tap element in which the output of the flip-flop is valid, the corresponding delay time value is determined by a number of delay tap elements iterated through to arrive at the first delay tap element in which the output of the flip-flop is invalid after the first delay tap element in which the output of the flip-flop is valid minus one (which would be the last delay tap element in which the output of the flip-flop is valid) multiplied by the predetermined delay time value.

Accordingly, the timing margin validation component 113 identifies the total delay time value associated with the first delay tap element in which the output of the flip-flop is valid and the total delay time value associated with the last delay tap element in which the output of the flip-flop is valid as a timing window for the predetermined Vref in which a signal may be correctly read as low (e.g., binary value of "0") or high (e.g., binary value of "1") without errors. The timing margin validation component 113 may identify additional timing windows at various predetermined Vrefs to generate an aperture (e.g., timing window) in which a signal may be correctly read as low (e.g., binary value of "0") or high (e.g., binary value of "1") without errors regardless of the Vref. The timing margin validation component 113 may increase and/or decrease (stepwise) the Vref and repeat the above noted steps to identify a timing window at the respective varied predetermined Vref. The timing margin validation component 113 generates the aperture by plotting each timing window (delay time value associated with the first and last delay tap element in which the output of the flip-flop is valid) at their respective varied predetermined Vref. Further details with regards to the operations of the timing margin validation component 113 are described below.

Figure 2:
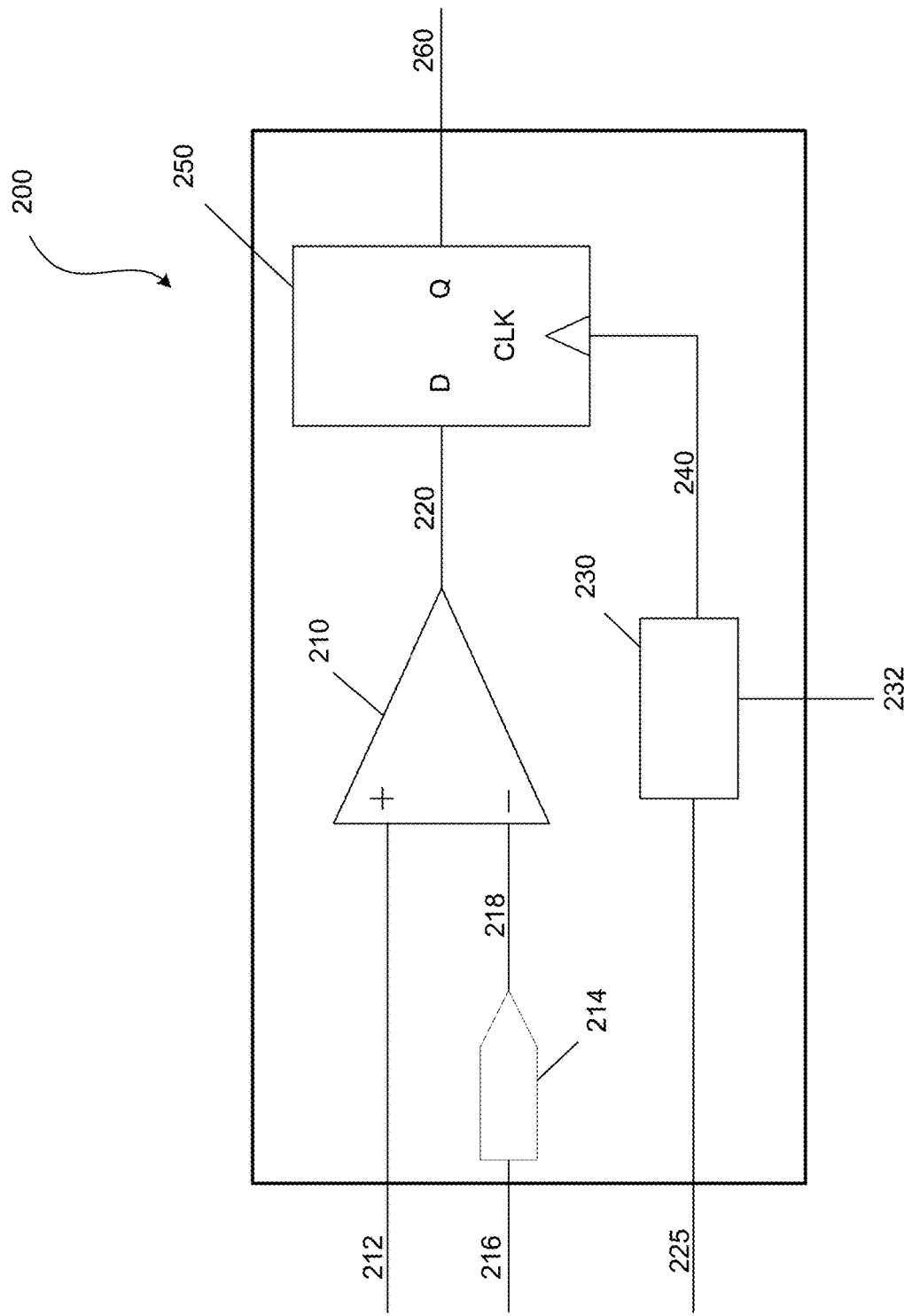
FIG. 2 illustrates components of the internal oscilloscope used to measure a timing margin of a memory device, in accordance with some embodiments of the present disclosure.

FIG. 2 illustrates an example internal oscilloscope 200 used to measure a timing margin of a memory device (e.g., memory device 130 and/or 140 of FIG. 1) and/or controller (e.g., memory sub-system controller 115 of FIG. 1), in accordance with some embodiments of the present disclosure. The internal oscilloscope 200 may include a comparator 210, a delay-lock loop (DLL) 230, and a flip-flop 250.

The timing margin validation component 113 of FIG. 1 inputs each delay tap element of a plurality of consecutive delay tap elements (starting with a first delay tap element among the plurality of consecutive delay tap elements) via an input 232 of the oscilloscope 200 connected to the DLL 230. Depending on the embodiment, the plurality of consecutive delay tap elements may be stored in the memory device or controller. After each input of the delay tap element via input 232, the DLL 230 delays a received signal strobe delay (e.g., DQS) 225 by a predetermined delay time value and outputs a delayed DQS 240 to be inputted into a clock (CLK) input of the flip-flop 250. The timing margin validation component 113 of FIG. 1, after each input of the delay tap element, inputs a known randomized data of a plurality of known randomized data via an input signal 212 (e.g., DQ 212) of the oscilloscope 200. Depending on the embodiment, the plurality of known randomized data may be stored in the memory device or controller.

The timing margin validation component 113 inputs a set of bits via an input 216 of the oscilloscope connected to a digital-to-analog converter (DAC) 214 to generate a reference voltage 218. The initial set of bits inputted via input 216 is used to generate the reference voltage (Vref) 218 equivalent to half DQ 212. Accordingly, based on the known randomized data inputted via DQ 212 and the set of bits inputted into the DAC 214 to generate Vref 218 is inputted into a comparator 210 to compare the known randomized data with Vref 218 and generate an output 220 which is then inputted into the flip-flop 250.

Once the flip-flop 250 receives the output 220 and the delayed DQS 240, the flip-flop 250 stores the output 220 based on an edge (e.g., rising edge or falling edge) of the delayed DQS 240. The stored data 260 is outputted by the flip-flop 250. After each output of the flip-flop 250, and prior to proceeding the next delay tap element among the plurality of consecutive delay tap elements, the timing margin validation component 113 compares the known randomized data with the stored data 260. If the known randomized data matches the stored data 260, the timing margin validation component 113 determines that the stored data 260 is valid. If the known randomized data does not match the stored data 260, the timing margin validation component 113 determines that the stored data 260 is invalid. Accordingly, with each delay tap element of the plurality of consecutive tap elements, the timing margin validation component 113 may identify and store a first delay tap element of the plurality of consecutive tap elements in which the stored data 260 is valid and a last delay tap element of the plurality of consecutive tap elements in which the stored data 260 is valid which represents a timing window at Vref 218.

Once the first and last delay tap element of the plurality of consecutive tap elements in which the stored data 260 is valid is identified, the timing margin validation component 113 may increase or decrease the Vref 218 (stepwise) by modifying the set of bits inputted via input 216 and repeat the process of inputting randomized known data of the plurality of known randomized data with the updated Vref 218 at each delay tap element of a plurality of consecutive delay tap elements (starting with a first delay tap element among the plurality of consecutive delay tap elements) to determine a first and last delay tap element of the plurality of consecutive tap elements in which the stored data 260 associated with the inputted randomized known data is valid representing a timing window at the updated Vref 218.

The timing margin validation component 113 may associate a total delay time value to each first and last delay tap element of the plurality of consecutive delay tap elements at each Vref 218 (including each updated Vref) which represents the timing window at each Vref. As noted above, each delay tap element of the plurality of consecutive delay tap elements applies the predetermined delay time value. The predetermined delay time value is determined by dividing a total bit period allocated to receive data at the receiving device by a number of the plurality of consecutive delay tap elements. Accordingly, the timing margin validation component 113, for example, determines that the total delay time value associated with the first delay tap element of the plurality of consecutive delay tap elements is a number associated with the first delay tap element (e.g., $5^{th}$ delay tap element of the plurality of consecutive delay tap elements) multiplied by the predetermined delay time value and the total delay time value associated with the last delay tap element is a number associated with the first delay tap element of the plurality of consecutive delay tap elements (e.g., $12^{th}$ delay tap element of the plurality of consecutive delay tap elements) multiplied by the predetermined delay time value.

Figure 3:
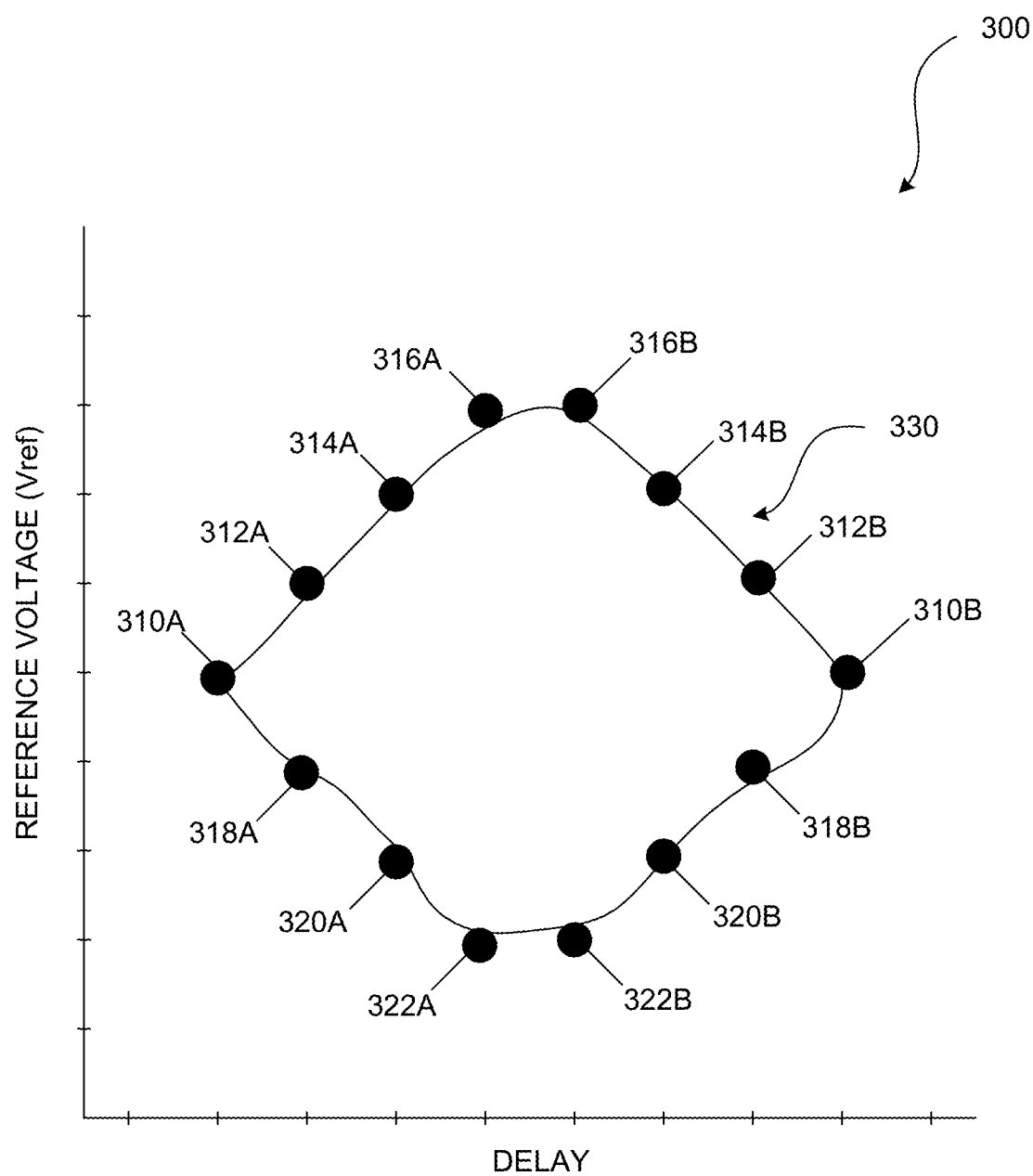
FIG. 3 illustrates a graph of a timing margin of a memory device measured using the internal oscilloscope, in accordance with some embodiments of the present disclosure.

FIG. 3 is a graphical illustration of a timing margin generated by the internal oscilloscope 122 and/132 of FIG. 1 and internal oscilloscope 200 of FIG. 2, in accordance with some embodiments of the present disclosure. The timing margin validation component 113, at each Vref may plot a total delay time value associated with a first delay tap element of the plurality of consecutive tap elements in which the stored data 260 of FIG. 2 is valid at the respective Vref (e.g., 310A, 312A, 314A, 316A, 318A, 320A, and 322A) and a last delay tap element of the plurality of consecutive tap elements in which the stored data 260 of FIG. 2 is valid at the respective Vref (e.g., 310B, 312B, 314B, 316B, 318B, 320B, and 322B). Each range at the respective Vref between the first delay tap element of the plurality of consecutive tap elements in which the stored data 260 of FIG. 2 is valid at the respective Vref (e.g., 310A, 312A, 314A, 316A, 318A, 320A, and 322A) and the last delay tap element of the plurality of consecutive tap elements in which the stored data 260 of FIG. 2 is valid at the respective Vref (e.g., 310B, 312B, 314B, 316B, 318B, 320B, and 322B) represent the timing window at the respective Vref. Collectively, various delays at each respective Vref (e.g., 310A-B, 312A-B, 314A-B, 316A-B, 318A-B, 320A-B, and 322A-B) forms an aperture 330 which represents a timing margin in which regards of the Vref and delay data may be correctly read as low (e.g., binary value of "0") or high (e.g., binary value of "1") without errors.

FIG. 4 is a flow diagram of an example method 400 to measure a timing margin of a memory device using an internal oscilloscope, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the timing margin validation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, for each delay tap element of a plurality of consecutive delay tap elements used to delay a system clock (e.g., DQS) inputted into an internal oscilloscope of a receiving device (e.g., memory device and/or controller), the processing logic inputs, to the internal oscilloscope of the receiving device with a predetermined reference voltage, a known randomized data pattern. Each delay tap element of the plurality of consecutive delay tap elements used to delay the system clock for a set period of time. The set period of time may be based on a predetermined total bit period and an amount of the plurality of consecutive delay tap elements. As previously described, the predetermined total bit period is associated with a total bit period allocated to receive data at the receiving device. In some embodiments, the known randomized data pattern may be varied with each delay tap element of the plurality of consecutive delay tap elements. Depending on the embodiment, the receiving device may be one of a memory device or a controller.

At operation 420, the processing logic identifies a first delay tap element among the plurality of consecutive delay tap elements in which an output of the internal oscilloscope matches the known randomized data pattern. As previously described, the processing logic, with each delay tap element of the plurality of consecutive tap elements, identifies and stores a first delay tap element of the plurality of consecutive tap elements in which the outputted data is valid. At operation 430, responsive to identifying the first delay tap element, the processing logic identifies a last delay tap element among the plurality of consecutive delay tap elements in which the output of the internal oscilloscope matches the known randomized data pattern. As previously described, the processing logic, with each delay tap element of the plurality of consecutive tap elements, identifies and stores a last delay tap element of the plurality of consecutive tap elements in which the outputted data is valid. As previously described, the last delay tap element of the plurality of consecutive tap elements in which the outputted data is valid refers to a delay tap element of the plurality of consecutive tap elements in which the outputted data is valid after the first delay tap element of the plurality of consecutive tap elements in which the outputted data is valid and before a subsequent delay tap element of the plurality of consecutive tap elements in which the outputted data is invalid. Accordingly, in some embodiments, the processing logic determines a timing window, based on the first delay tap element and the last delay tap element, at the predetermined reference voltage.

In some embodiments, the processing logic varies the predetermined reference voltage of the internal oscilloscope and responsive to varying the predetermined reference voltage of the internal oscilloscope, performs the inputting, the identifying, and the identifying with the receiving device at the varied predetermined reference voltages to determine additional timing windows for each of the varied predetermined reference voltages. Depending on the embodiments, to vary the predetermined reference voltage the processing logic increases or decreases stepwise the predetermined reference voltage. In some embodiments, the processing logic generates, based on the timing window at the predetermined reference voltage and additional timing windows at the varied predetermined reference voltage, an aperture, wherein the aperture refers to a timing margin of the receiving device.

FIG. 5 is a flow diagram of an example method 500 to measure a timing margin of a memory device using an internal oscilloscope, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the timing margin validation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic inputs known randomized data patterns into an internal oscilloscope of a receiving device at a first reference voltage with varying delays applied to a system clock of the receiving device. Depending on the embodiment, the receiving device may be one of a memory device or a controller.

At operation 520, the processing logic identifies a first delay amount associated with a first delay of the varying delays in which the known randomized data patterns matches an output of the internal oscilloscope.

At operation 530, the processing logic identifies a second delay amount associated with a last delay of the varying delays in which the known randomized data patterns matches the output of the internal oscilloscope.

At operation 540, the processing logic generates a graph of the first delay amount and the second delay amount at the first reference voltage.

Figure 6:
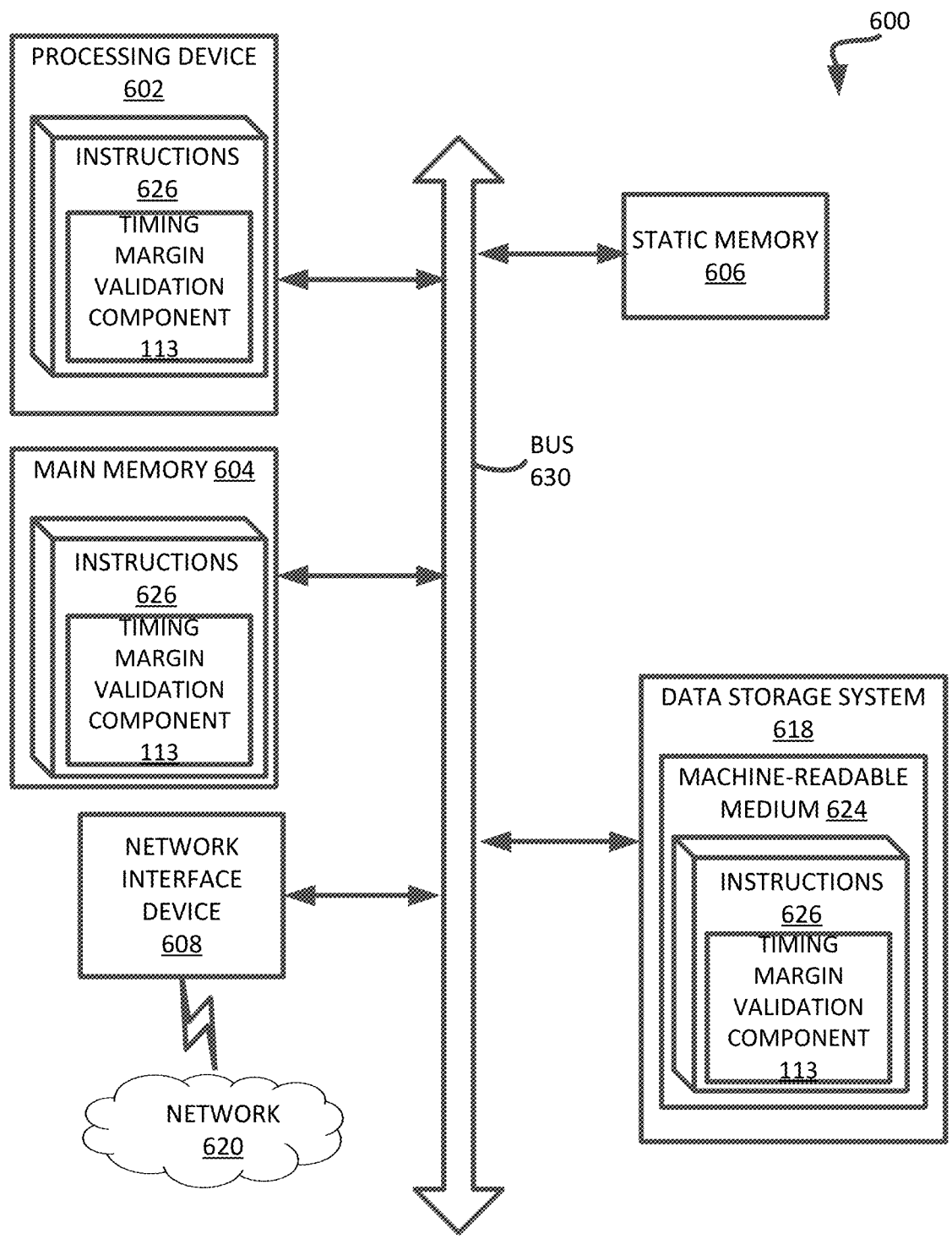
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the timing margin validation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a timing margin validation component (e.g., the timing margin validation component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   for each delay tap element of a plurality of consecutive delay tap elements used to delay a system clock inputted into an internal oscilloscope of a receiving device, inputting, to the internal oscilloscope of the receiving device with a predetermined reference voltage, a known randomized data pattern;
   identifying a first delay tap element among the plurality of consecutive delay tap elements for which an output of the internal oscilloscope matches the known randomized data pattern; and
   responsive to identifying the first delay tap element, identifying a last delay tap element among the plurality of consecutive delay tap elements for which the output of the internal oscilloscope matches the known randomized data pattern.

2. The method of claim 1, further comprising:
   determining a timing window, based on the first delay tap element and the last delay tap element, at the predetermined reference voltage, wherein the timing window indicates a period of time in which data is read without any errors.

3. The method of claim 1, wherein the known randomized data pattern is varied with each delay tap element of the plurality of consecutive delay tap elements.

4. The method of claim 1, wherein each delay tap element of the plurality of consecutive delay tap elements used to delay the system clock for a set period of time.

5. The method of claim 4, wherein the set period of time is based on a predetermined total bit period and an amount of the plurality of consecutive delay tap elements.

6. The method of claim 1, further comprising:
   varying the predetermined reference voltage of the internal oscilloscope;
   responsive to varying the predetermined reference voltage of the internal oscilloscope, performing the inputting, the identifying, and the identifying with the receiving device at the varied predetermined reference voltages; and
   determining additional timing windows for each of the varied predetermined reference voltages.

7. The method of claim 6, wherein varying the predetermined reference voltage includes increasing or decreasing stepwise the predetermined reference voltage.

8. The method of claim 6, further comprising:
   generating, based on the timing window at the predetermined reference voltage and additional timing windows at the varied predetermined reference voltage, an aperture, wherein the aperture refers to a timing margin of the receiving device.

9. The method of claim 1, wherein the receiving device is one of: a memory device or a controller.

10. A system comprising:
    a memory device; and
    a processing device, operatively coupled with the memory device to perform operations comprising:
    for each delay tap element of a plurality of consecutive delay tap elements used to delay a system clock inputted into an internal oscilloscope of a receiving device, inputting, to the internal oscilloscope of the receiving device with a predetermined reference voltage, a known randomized data pattern;
    identifying a first delay tap element among the plurality of consecutive delay tap elements in which an output of the internal oscilloscope matches the known randomized data pattern; and
    responsive to identifying the first delay tap element, identifying a last delay tap element among the plurality of consecutive delay tap elements in which the output of the internal oscilloscope matches the known randomized data pattern.

11. The system of claim 10, wherein the processing device is to perform operations further comprising:
    determining a timing window, based on the first delay tap element and the last delay tap element, at the predetermined reference voltage, wherein the timing window indicates a period of time in which data is read without any errors.

12. The system of claim 10, wherein the known randomized data pattern is varied with each delay tap element of the plurality of consecutive delay tap elements.

13. The system of claim 10, wherein each delay tap element of the plurality of consecutive delay tap elements used to delay the system clock for a set period of time.

14. The system of claim 13, wherein the set period of time is based on a predetermined total bit period and an amount of the plurality of consecutive delay tap elements.

15. The system of claim 10, wherein the processing device is to perform operations further comprising:
    varying the predetermined reference voltage of the internal oscilloscope;
    responsive to varying the predetermined reference voltage of the internal oscilloscope, performing the inputting, the identifying, and the identifying with the receiving device at the varied predetermined reference voltages; and
    determining additional timing windows for each of the varied predetermined reference voltages.

16. The system of claim 15, wherein varying the predetermined reference voltage includes increasing or decreasing stepwise the predetermined reference voltage.

17. The system of claim 15, further comprising:
    generating, based on the timing window at the predetermined reference voltage and additional timing windows at the varied predetermined reference voltage, an aperture, wherein the aperture refers to a timing margin of the receiving device.

18. The system of claim 10, wherein the receiving device is one of: a memory device or a controller.

19. A non-transitory computer-readable storage medium comprising instructions that, when executed by a processing device, cause the processing device to perform operations comprising:
    inputting known randomized data patterns into an internal oscilloscope of a receiving device at a first reference voltage with varying delays applied to a system clock of the receiving device;
    identifying a first delay amount associated with a first delay of the varying delays in which the known randomized data patterns matches an output of the internal oscilloscope;
    identifying a second delay amount associated with a last delay of the varying delays in which the known randomized data patterns matches the output of the internal oscilloscope; and generating a graph of the first delay amount and the second delay amount at the first reference voltage.

20. The non-transitory computer-readable storage medium of claim 19, wherein the receiving device is one of: a memory device or a controller.

* * * * *